United States Patent
Engelen (10) Patent No.: US 11,611,012 B2
(45) Date of Patent: Mar. 21, 2023

(54) METHOD FOR MANUFACTURING LIGHTING DEVICE

(71) Applicant: Lumileds LLC, San Jose, CA (US)

(72) Inventor: Rob Jacques Paul Engelen, Eindhoven (NL)

(73) Assignee: Lumileds LLC, San Jose, CA (US)

(*) Notice: Subject to any disclaimer, the term of this patent is extended or adjusted under 35 U.S.C. 154(b) by 38 days.

(21) Appl. No.: 17/111,289

(22) Filed: Dec. 3, 2020

(65) Prior Publication Data

US 2021/0193862 A1 Jun. 24, 2021

(30) Foreign Application Priority Data

Dec. 5, 2019 (EP) .................................. 19213771

(51) Int. Cl.
*H01L 33/00* (2010.01)
*H01L 33/50* (2010.01)

(52) U.S. Cl.
CPC .......... *H01L 33/005* (2013.01); *H01L 33/502* (2013.01); *H01L 2933/0041* (2013.01)

(58) Field of Classification Search
CPC ............. H01L 33/005; H01L 33/502; H01L 2933/0041; G02B 5/1814; G02B 5/1857; G02B 27/0944; G02B 27/62; G03F 7/70408
See application file for complete search history.

(56) References Cited

U.S. PATENT DOCUMENTS

| 5,015,835 A | 5/1991 | Ohuchida et al. |
| 2011/0013743 A1* | 1/2011 | Nakamura ............. A61B 6/484 378/19 |
| 2012/0307976 A1* | 12/2012 | Kaneko .................. G21K 1/025 378/62 |

(Continued)

FOREIGN PATENT DOCUMENTS

| DE | 202019103346 U1 | 10/2019 |
| EP | 3832392 | 6/2021 |

OTHER PUBLICATIONS

"European Application Serial No. 19213771.9, Extended European Search Report dated Jun. 22, 2020", 10 pgs.

(Continued)

*Primary Examiner* — Jonathan Han
(74) *Attorney, Agent, or Firm* — Schwegman, Lundberg & Woessner, P.A.

(57) ABSTRACT

A lighting device and method for manufacturing the lighting device are provided. A substrate contains at least a first surface and a second surface opposing the first surface. Light-sensitive material is provided on the first surface and/or the second surface. The light-sensitive material is exposed to light by applying the light from a light source onto a mask having a periodic pattern of light-attenuating features with interspaced light-permeable features. The light forms a periodic distribution of high intensity regions with interspaced low intensity regions at the first surface and/or the second surface. A periodic structure is formed based on the exposed light-sensitive material and includes light-attenuating features and light-permeable features corresponding to the light-attenuating features and light-permeable features of the mask.

20 Claims, 3 Drawing Sheets

(56) References Cited

U.S. PATENT DOCUMENTS

| | | | |
|---|---|---|---|
| 2014/0023973 A1* | 1/2014 | Marconi | G03F 7/2053 |
| | | | 355/55 |
| 2016/0062246 A1* | 3/2016 | Clube | G03F 7/70408 |
| | | | 355/67 |
| 2018/0048811 A1* | 2/2018 | Waller | G02B 27/58 |
| 2018/0236596 A1* | 8/2018 | Ihlemann | B23K 26/067 |
| 2019/0384141 A1 | 12/2019 | Engelen et al. | |

OTHER PUBLICATIONS

"European Application Serial No. 19213771.9, Response filed Nov. 11, 2021 to Extended European Search Report dated Jun. 22, 2020", 10 pgs.

* cited by examiner

METHOD FOR MANUFACTURING LIGHTING DEVICE

PRIORITY CLAIM

This application claims the benefit of priority to EP Patent Application Serial No. 19 213 771.9, filed Dec. 12, 2019, which is incorporated herein by reference in its entirety.

TECHNICAL FIELD

The present disclosure relates to methods for manufacturing lighting devices, in particular for manufacturing lighting devices for applications in the technical field of pattern illuminators for three dimensional (3D) imaging purposes.

BACKGROUND

Various developments aim at enabling 3D imaging to be used e.g. in or for applications for example for smartphones or similar mobile devices. In particular in case of 3D imaging for smartphones, corresponding devices should ideally be incomplex and should have a small form factor.

A method of acquiring a 3D representation of an object in 3D imaging is based on an active illumination of the object, wherein the object is illuminated with a specifically structured light pattern. An optical sensor such as a camera of a smartphone may then be used to obtain a 2D image of the object illuminated by the structured light pattern. The shape of the object distorts the observed light pattern, the distortions enabling reconstruction of a 3D representation of the object.

A more specific exemplary technique for creating beneficial structured light patterns (line patterns) using LEDs is disclosed in European patent application no. 18178203.8. As disclosed in more detail in this application, a lighting device beneficially employable for 3D imaging comprises a substrate in form of a glass plate, where both surfaces of the glass plate are provided with respective metallic gratings with about 50% metal coverage (referred to as dual grating further herein).

It turned out that in particular a lighting device comprising such glass plate with a dual grating is beneficial for 3D imaging applications. However, in order to enable an optimal function of the lighting device, the respective gratings should be mutually aligned with high accuracy. Approaches that already yield working lighting devices are based on lithography technology also used for fabrication of semiconductor devices. Nevertheless, an optimal mutual alignment of the respective gratings that would allow for further improved function and for enhanced reproducibility and reliability of corresponding lighting devices in particular when produced at high numbers still remains a challenge.

BRIEF DESCRIPTION OF THE DRAWINGS

Examples of the invention will now be described in detail with reference to the accompanying drawings, in which.

DETAILED DESCRIPTION OF THE EMBODIMENTS

A method for manufacturing a lighting device is provided that allows for an improved alignment of periodic structures such as gratings included in a dual grating.

According to a first aspect, a method for manufacturing a lighting device includes providing a substrate comprising at least a first surface and a second surface opposing the first surface; providing light-sensitive material on at least one of the first surface and the second surface; exposing the light-sensitive material to light by applying the light from a light source onto a mask comprising a periodic pattern of light-attenuating features with interspaced light-permeable features and configured to cause the light from the light source to form a periodic distribution of high intensity regions with interspaced low intensity regions at at least the at least one of the first surface and the second surface on which the light-sensitive material is provided; forming a periodic structure based on the exposed light-sensitive material, the periodic structure comprising light-attenuating features and light-permeable features; wherein a thickness d of the substrate between the first surface and the second surface is given by the following equation:

$$d = n\frac{a^2 n_1^2}{\lambda n_2}, \quad (1)$$

where n is an integer, n≥1, a is a period of the periodic pattern of light-attenuating features and interspaced light-permeable features of the mask, $\lambda$ is a wavelength of the light emitted from the light source, $n_1$ is the refractive index of the medium between the mask and the first surface, wherein the first surface faces the mask, and $n_2$ is the refractive index of the substrate between the first and second surfaces.

According to a second aspect, a lighting device manufactured with a method according to the first aspect includes: a substrate comprising at least a first surface and a second surface opposing the first surface; a first periodic structure comprising light-attenuating features and light-permeable features interspaced between the light-attenuating features, the light-attenuating features and the light-permeable features being periodically arranged on the first surface; a second periodic structure comprising light-attenuating features and light-permeable features corresponding to the light-attenuating features and the light-permeable features of the first periodic structure and being arranged on the second surface; in which a thickness d of the substrate between the first periodic structure and the second periodic structure is given by the following equation:

$$d = v\frac{2a^2 n_2}{\lambda}; \quad (2)$$

where v is a constant in between 0.5 and 1.5, a is a period of the first and/or the second periodic structure, $\lambda$ is in between 200 nm and 500 nm, and $n_2$ is the refractive index of the substrate between the first and second surface.

According to a third aspect, an imaging device is provided with the lighting device according to the second aspect.

The method according to the first aspect comprises forming a periodic structure based on the exposed light-sensitive material. In other words, a periodic structure is formed from or within or by the exposed light sensitive material. Yet put differently, in an exemplary embodiment, forming a periodic structure based on the exposed light-sensitive material, the periodic structure comprising light-attenuating features and light-permeable features may be understood as transforming the exposed light-sensitive material into a periodic structure, the periodic structure comprising light-attenuating features and light-permeable features.

The periodic structure is thus formed as a result of exposing the light sensitive material. Depending on the particular type of material chosen, regions of high light intensity exposure (light passing light-permeable features of the mask) may result in a corresponding portion of the light-sensitive material to be converted into a corresponding light-permeable feature of the periodic structure or into a corresponding light-attenuating feature of the periodic structure. Likewise depending on the particular type of material chosen, regions of low (or no) light intensity exposure (light passing light-attenuating features of the mask) may result in a corresponding portion of the light-sensitive material to be converted into (or to remain) a corresponding light-attenuating feature of the periodic structure or to be converted into a corresponding light-permeable feature of the periodic structure. Thus, in an exemplary embodiment, the step of forming a periodic structure based on the exposed light-sensitive material is a step of forming a periodic structure based on the exposed light-sensitive material, the periodic structure comprising light-attenuating features and light-permeable feature corresponding to the light-attenuating features and light-permeable features of the mask, or vice versa.

In an exemplary embodiment, the lighting device manufactured by the method according to the first aspect is a lighting device that has a substrate, whereby periodic structures are provided on the first surface and/or on the second surface of the substrate. For example, periodic structures may in an exemplary embodiment be provided on both the first and the second surfaces, respectively and may thus correspond to respective gratings and may thus form an example of the mentioned dual grating. The lighting device may in an exemplary embodiment further comprise one or more light emitting diodes (LEDs) arranged at the lighting device to emit light (e.g. with a wavelength in the visible or infrared range) towards the dual grating such that light transmitted by the dual grating can be used to produce a structured light pattern on an object for 3D imaging of the object.

In an exemplary embodiment, the substrate is a transparent substrate such as, e.g., a glass substrate. In an exemplary embodiment, the first and second surfaces of the substrate are essentially mutually parallel. These surfaces may e.g. correspond to two main surfaces of the substrate being mutually spaced at a distance a of e.g. 1 mm. In an exemplary embodiment, a distance between the first surface and the second surface is in between 0.3 mm and 1.5 mm, in between 0.4 mm and 1.4 mm, or in between 0.5 and 1.1 mm. In an exemplary embodiment, the first and the second surface are essentially mutually parallel, the term essentially being understood as reflecting typical manufacturing tolerances (in other words, in an exemplary embodiment, a maximum angle between the first surface and the second surface is 0°±0.3°, in particular 0°±0.1°).

In an exemplary embodiment, the light-sensitive material comprises or consists of a positive or negative photoresist and is applied in form of a layer on the first and/or the second surface. A photoresist is a material used e.g. in photolithography to form a patterned coating on a surface. For example, light for illuminating or exposing a photoresist can be guided through a dedicated mask comprising a periodic pattern of light-attenuating features with interspaced light-permeable features to form a periodically structured light pattern for illuminating the photoresist. After the exposure, a developer (e.g. a solvent) is applied to the exposed photoresist. In case of a positive photoresist, the light-sensitive material is degraded by the light in regions corresponding to a high intensity of the light pattern and the developer removes corresponding material in these regions. A patterned coating is thus created in which material is removed in the regions corresponding to high intensity of the light pattern and in which material remains in regions corresponding to low intensity of the light pattern (where light was e.g. blocked by the mask). In case of negative photoresist, the light-sensitive material is strengthened in the exposed regions such that the developer removes material in the non-exposed regions where the mask blocked transmission of light.

It is to be noted that "providing" the light-sensitive material on at least one of the first surface and the second surface is in an exemplary embodiment to be understood as forming, e.g. a layer of, the light-sensitive material on the at least one of the first surface and the second surface.

In an exemplary embodiment, the light-attenuating features of the mask consist of or comprise a material, e.g. a metallic material, configured to attenuate or block transmission of light. Light-attenuating features may in general comprise arbitrary shapes to allow for complex mask structures. In such case, the period a may correspond to a period of a sub-structure such as a grating (stripe or line pattern) comprised by the complex mask structure. However, in an exemplary embodiment, the light-attenuating features comprise or consist of elongated features, e.g. of lines and/or stripes. In this embodiment, the light-permeable features are regions of the periodic pattern configured to allow for transmission of light, e.g. correspond to regions in between the light-attenuating features where the material configured to attenuate or block transmission of light is not provided. In case the light-attenuating structures comprise or consist of the elongated features (e.g. lines and/or shapes), the light-permeable features may comprise or consist of corresponding elongated features (e.g. line and/or stripe shaped regions) not comprising said material and being interspaced in between corresponding light-attenuating features. In other words, with the elongated light-attenuating and light-permeable features, in an exemplary embodiment, the mask corresponds to or comprises a grating (e.g. a diffraction grating) with light-attenuating features forming a stripe or line pattern. It is noted that while gratings may generally comprise more than one set of stripes and/or lines, in an exemplary embodiment, the mask comprises a single set of stripes and/or lines. In an exemplary embodiment, the grating has a planar shape and is—at least during the step of exposing—arranged essentially parallel to the first surface and to the second surface.

It turned out that in particular use of a mask comprising such grating is advantageous as a grating mask enables forming corresponding non-complex periodic structures in form of corresponding gratings on the first and/or second surface of the substrate. In turn, a corresponding lighting device can thus be used to apply a non-complex stripe or line pattern on an object to be imaged that allows for a fast and precise reconstruction of the object's 3D shape.

In an exemplary embodiment, the mask corresponds to or comprises a grating having a regular period (or pitch). In other words, in this embodiment, the period, i.e. the sum of the width of a light-attenuating feature and the width of an adjacent light-permeable feature is essentially constant across the grating—"essentially" being understood herein as within usual fabrication tolerances.

In particular such grating of regular period enables a corresponding mask to be configured to cause light emitted from the light source onto the mask to diffract, i.e. to constructively interfere to form high intensity regions, and to destructively interfere to form low intensity regions. In turn, when used to illuminate the first surface and/or the second surface onto which the light-sensitive material is applied, a mask comprising a grating of regular period enables forming periodic structures on the first and/or on the second surface of the substrate that are images of the grating of the mask.

More specifically, when, e.g., light in form of a plane wave is incident upon the grating, due to diffraction of the incident light, images of the grating are formed at regular distances from the grating plane. In optics, this effect is generally referred to as Talbot effect and the regular distance is called the Talbot length (referred to as $L_{Talbot}$ herein). The repeated images may be referred to as self images or Talbot images. Furthermore, at half the Talbot length, a self-image also occurs, but phase-shifted by half a period. Further, sub-images are formed at different fractions of the Talbot length and the collection of images and sub-images may be referred to as a Talbot carpet.

While the Talbot effect has been used in lithography to enhance accuracy in producing complex structures (as reported for example in "Talbot lithography: Self-imaging of complex structures", A. Isoyan, et al., Journal of vacuum science & technology B), as identified herein the Talbot effect can be particularly advantageously exploited to enhance alignment of the above mentioned dual gratings. By using the self-imaging feature provided by the Talbot effect, for example a grating can be formed that is an essentially identical image of a mask grating or a pair of gratings can be formed simultaneously being self-images of a mask grating. It was found that the effect can be exploited advantageously when a thickness of the substrate between the first and the second surface corresponds to a multiple of the Talbot length or of half the Talbot length as defined with equation (1). Providing this relation between substrate thickness, light wavelength and grating period advantageously enables manufacturing of a substrate with a dual grating in particular in accordance with the two exemplary methods disclosed below.

According to a first exemplary method, in an exemplary embodiment, the light-sensitive material is provided on one of the first or the second surface of the substrate and the mask is provided on the other one of the first or the second surface. In this embodiment, the mask may for example be provided using conventional lithography technology. It is to be understood that being "provided" is in an exemplary embodiment to be understood in the sense of being formed on. In other words, in the first exemplary method, the mask may be formed on, e.g. in direct contact with (or in close proximity with, e.g. being spaced in between 0 and 100 μm from), the other one of the first or the second surface.

In the first exemplary method, the step of exposing then comprises illuminating the light-sensitive material with a self-image of the mask. In other words, the Talbot effect may then be advantageously exploited to illuminate the light-sensitive material on the surface opposing the surface with the mask with a Talbot image or self-image of the mask to thus expose the light-sensitive material to a periodic light pattern that is in essentially perfect alignment with the mask. It is noted that the Talbot image may for example be the first Talbot image at the full Talbot length $L_{Talbot}$ (n=2) in case the light-sensitive material is a negative photoresist or the first Talbot image at half of the Talbot length $L_{Talbot}/2$ (n=1) if the light-sensitive material is a positive photoresist. It is noted that in exemplary embodiments, also higher order Talbot images can be employed, e.g. n=3, n=4, etc.

A periodic structure (e.g. a metallic grating corresponding to a grating of the mask) may then be formed by applying a developer (e.g. an appropriate solvent) to the exposed light-sensitive material to form a patterned coating of remaining photoresist. The patterned coating may then be transformed into a periodic structure e.g. into a metallic grating. To this end, e.g. a lift-off process may be employed according to which a metal layer is provided on the patterned coating, i.e. on a surface of the remaining photoresist and on interspaced surfaces of the substrate where photoresist has been removed by the developer. Portions of remaining photoresist and deposited metal are removed e.g. employing wet etching and ultrasound such that a metallic grating on the surface of the substrate remains. In an exemplary embodiment, the periodic structure formed based on the exposed light-sensitive-material comprises light-attenuating feature and light-permeable features comprising or consisting of at least one of Platinum (Pt), Nickel (Ni), Cupper (Cu), Tungsten (W), Titanium (Ti), Gold (Au), Silver (Ag), and/or Aluminium (Al). In particular W and Pt where found to advantageously allow a beneficial adhesion on the substrate, e.g. on a substrate comprising glass (e.g. W provides beneficial adhesion and low reflection). Further, Pt and Ti was found to provide beneficial adhesion. Au turned out to be a material enabling a particularly beneficial reflection and can be provided e.g. on an outer surface of a layer comprising one or more of these materials.

In other words, in this exemplary embodiment, the step of forming then comprises forming the periodic structure based on the exposed light-sensitive material on the first or the second surface on which the light-sensitive material has been provided. Thereby, "based on" the exposed light-sensitive material comprises in an exemplary embodiment applying a developer to the exposed light-sensitive material to form a patterned coating of light-sensitive material, and transforming the patterned coating of light-sensitive material into the periodic structure.

According to a second exemplary method, in an exemplary embodiment, the light-sensitive material is provided on the first surface of the substrate and on the second surface of the substrate, and the step of exposing comprises illuminating the light-sensitive material on the first surface of the substrate and the light-sensitive material on the second surface of the substrate with respective self-images of the mask.

Thus, in this example, the Talbot effect is advantageously exploited to illuminate the light-sensitive material on one of the surfaces with a self-image or Talbot image of the mask and to illuminate the light-sensitive material on the other one of the surfaces with a different (e.g. adjacent or subsequent) Talbot image of the mask to thus expose the light-sensitive material on both surfaces simultaneously in one step and in essentially perfect alignment with the mask.

For example, the light-sensitive material provided on the first surface may be illuminated with a zeroth Talbot image of the mask, i.e. may be exposed to the light intensity distribution immediately behind the mask by placing the mask in close proximity or in contact with the first surface. Further, in this example, the light-sensitive material provided on the second surface of the substrate may then be illuminated with a self-image or Talbot image at the full Talbot length $L_{Talbot}$ (n=2) or at half of the Talbot length $L_{Talbot}/2$ (n=1), e.g. depending on whether the light-sensitive material is a positive or a negative photoresist.

In this example, by advantageously exploiting the Talbot effect, the light-sensitive material on both surfaces of the substrate can be illuminated with light intensity patterns that are essentially perfectly aligned with the mask. Periodic structures (e.g. metallic gratings corresponding to and in alignment with a grating of the mask) may then be formed as described above by applying a developer to the exposed light-sensitive material to form a respective patterned coating on each of the first and the second surface of the substrate and by then transforming the respective patterned coatings into respective periodic structures (e.g. metallic gratings) for example by the mentioned lift-off process.

In other words, in this exemplary embodiment, the step of forming then includes forming the periodic structure based on the exposed light-sensitive material on the first surface of the substrate and based on the exposed light-sensitive material on the second surface of the substrate. Thereby, "based on" the exposed light-sensitive material comprises in an exemplary embodiment applying a developer to the exposed light-sensitive material on the first surface of the substrate to form a patterned coating of light-sensitive material on the first surface of the substrate, applying a developer to the exposed light-sensitive material on the second surface of the substrate to form a patterned coating of light-sensitive material on the second surface of the substrate, and transforming the respective patterned coatings on the first surface of the substrate and on the second surface of the substrate into respective periodic structures on the first surface of the substrate and on the second surface of the substrate.

As a result, by exploiting the self-imaging capability offered by the Talbot effect, it becomes possible to form a dual grating on a transparent substrate, where the gratings forming the dual grating are essentially perfectly aligned with respect to each other.

In an exemplary embodiment of the second exemplary method, for illuminating the light-sensitive material on both surfaces of the substrate, with respective self-images of the mask, at least during the step of exposing, the mask is arranged relative to the substrate to cause the light from the light source to form a periodic distribution of high intensity regions with interspaced low intensity regions at the first surface and at the second surface. For example, the mask may be arranged at a suitable distance, for example at a full Talbot length from a closest surface of the mask, such that a first non-shifted Talbot image is formed at this closest surface of the substrate and that a next non-shifted Talbot image is formed on the opposing surface of the substrate.

In an exemplary embodiment of the second exemplary method, at least during the step of exposing, a smallest distance between the mask and the substrate, i.e. a distance between the mask and the one of the first or second surface of the mask closest to the mask, is less than half of the Talbot length, in particular less than one fourth of the Talbot length, or the mask is in contact with the one of the first or second surface of the mask closest to the mask. By keeping the distance within this range, a zeroth order Talbot image can be formed on the surface of the substrate nearest to the mask with sufficient contrast can be formed that allows forming a suitable periodic structure on this nearest surface. It is noted that in case a non-zero distance is kept between the mask and the closest surface of the substrate (which may be referred to as proximity lithography), a beneficial distance was found to be in between 10 μm and 150 μm, in particular in between 20 μm and 100 μm. It is however also noted that using a mask illuminator for lithography as the light source, which is configured to provide uniform illumination of the mask and highly collimated light, an effect of a distance between the mask and the closest surface can be minimized which facilitates production and reduces a potential or errors. Thus, in an exemplary embodiment, the light source is configured for applying a collimated beam of light onto the mask, wherein a Full Width Half Maximum (FWHM) of light intensity as a function of angle (angle of beam divergence) is smaller than 4°, in particular smaller than 3°, in particular smaller than 2°, in particular smaller than 1°.

In an exemplary embodiment of the second exemplary method the light-sensitive material provided on the surface of the substrate closest to the mask is provided partially transparent for light emitted from the light source. To this end, for example a thickness and/or a composition of the light-sensitive material can be adjusted accordingly. For example, in an exemplary embodiment, the light-sensitive material provided on the surface of the substrate closest to the mask is provided as a layer configured to transmit at least 50% of the intensity of light incident onto the layer from the light source, in particular at least 80% of the intensity of light incident onto the layer from the light source. By providing the light-sensitive material on the surface closest to the mask at least partially transparent for light emitted from the light source, formation of a Talbot image on the opposing surface of the substrate is advantageously facilitated.

In an exemplary embodiment, at least during the step of exposing, the mask is arranged parallel to both of the first surface and the second surface. In this way, it becomes advantageously possible to minimize imaging imperfections which may be caused by an undesirable angle of the mask with respect to the surfaces of the substrate.

In an exemplary embodiment, the period (or pitch) a is between 5 μm and 20 μm, in particular in between 9 and 16 μm. In other words, a period or pitch of the mask is larger as compared e.g. to structures used in current lithography applications for fabricating semiconductor components. Using e.g. a mask grating of such pitch, corresponding gratings, in particular dual gratings, can be manufactured that based on the corresponding size are advantageously applicable for lighting devices for 3D imaging applications.

In an exemplary embodiment, the periodic pattern (of the mask) corresponds to or comprises a grating, wherein the light-attenuating features correspond to essentially identical, parallel, elongated elements, in particular formed by a material comprising a metal. For example, the grating may correspond to a diffraction grating and/or may comprise a regular pitch or period. The metal may for example comprise or consist of Aluminum. As explained above, a grating mask is in particular advantageous as it enables manufacturing of a dual grating of incomplex structure which in turn enables a lighting device that can apply an incomplex light pattern onto an object to be imaged which allows for fast and precise reconstruction of the object's 3D shape. Thus, in an exemplary embodiment, the periodic structure formed on the first and/or on the second surface corresponds to or comprises a grating, in particular to a metallic grating, e.g. comprising or consisting of at least one of Platinum (Pt), Nickel (Ni), Cupper (Cu), Tungsten (W), Titanium (Ti), Gold (Au), Silver (Ag), and/or Aluminium (Al). For example, the grating may comprise a 50% coverage, e.g. metal coverage. In other words, 50% of a surface covered by the grating may be configured to attenuate or block transmission of light from the light source.

In an exemplary embodiment, the method further comprises applying a developer to the at least one of the first surface or the second surface on which the light-sensitive material (e.g. layer of light-sensitive material) is provided after the light from the light source has been applied to remove the light-sensitive material at least partially in regions corresponding to the low intensity regions; and replacing remaining light-sensitive in regions corresponding to the high intensity regions or the low intensity regions by a material comprising a metal to form the periodic structure based on the exposed light-sensitive material. As explained above, the replacing may comprise employing a lift-off process to transform a patterned coating of photoresist generated by the step of exposing into the periodic structure, e.g. into a metallic grating.

In an exemplary embodiment, the light source is or comprises at least one light emitting diode (LED), laser, and/or at least one Hg arc lamp. A particular advantage offered by use of these particular light sources is that these light sources may offer a very high uniformity over a corresponding exposure area with a narrow beam (e.g. of 1° FHWM). Such narrow beam is particularly advantageous as it may help to prevent blurring of a Talbot carpet formed with the light sources at large distances. Such light sources are advantageous as they are inexpensive and easily replaceable in case of damage but nevertheless allow for stable and intense illumination within the needed wavelength range. In an exemplary embodiment, the wavelength is a UV (ultraviolet) or blue wavelength, in particular in between 200 nm and 500 nm, in particular in between 340 nm and 425 nm.

In an exemplary embodiment, the lighting device according to the second aspect is manufactured using the method according to the first aspect or according to any of its embodiments described above.

As disclosed above, the second aspect relates to a lighting device, in particular manufactured using the method according to the first aspect. It is noted that it turned out that a method of manufacturing the lighting device, in particular the method according to the first aspect, is reflected by the constant v, which therefore may be referred to as manufacturing or process constant. In an exemplary embodiment, v is in between 0.5 and 1.5. In a further exemplary embodiment, v is in between 0.6 and 1.0. In an additional, further exemplary embodiment, v is in between 0.7 and 0.9. Given this, equation (2) of the second aspect of the invention defines a unique relation between the distance d and the period of the first and/or the second periodic structure, reflecting the inventive use of the Talbot effect in the lighting device according to the second aspect.

In an exemplary embodiment, the imaging device according to the third aspect including the lighting device according to the second aspect may employ images of an object such as a face illuminated with a line pattern generated by the lighting device according to the second aspect for example for face authentication and/or anti-spoofing. In other words, in an exemplary embodiment, the imaging device according to the third aspect is an authentication device.

The features and example embodiments described above may equally pertain to the different aspects according to the above. In particular, with the disclosure of features relating to the lighting device according to first aspect, also corresponding features relating to a method for producing a lighting device according to the second aspect and to the 3D imaging device according to the third aspect are disclosed.

Figure 1:
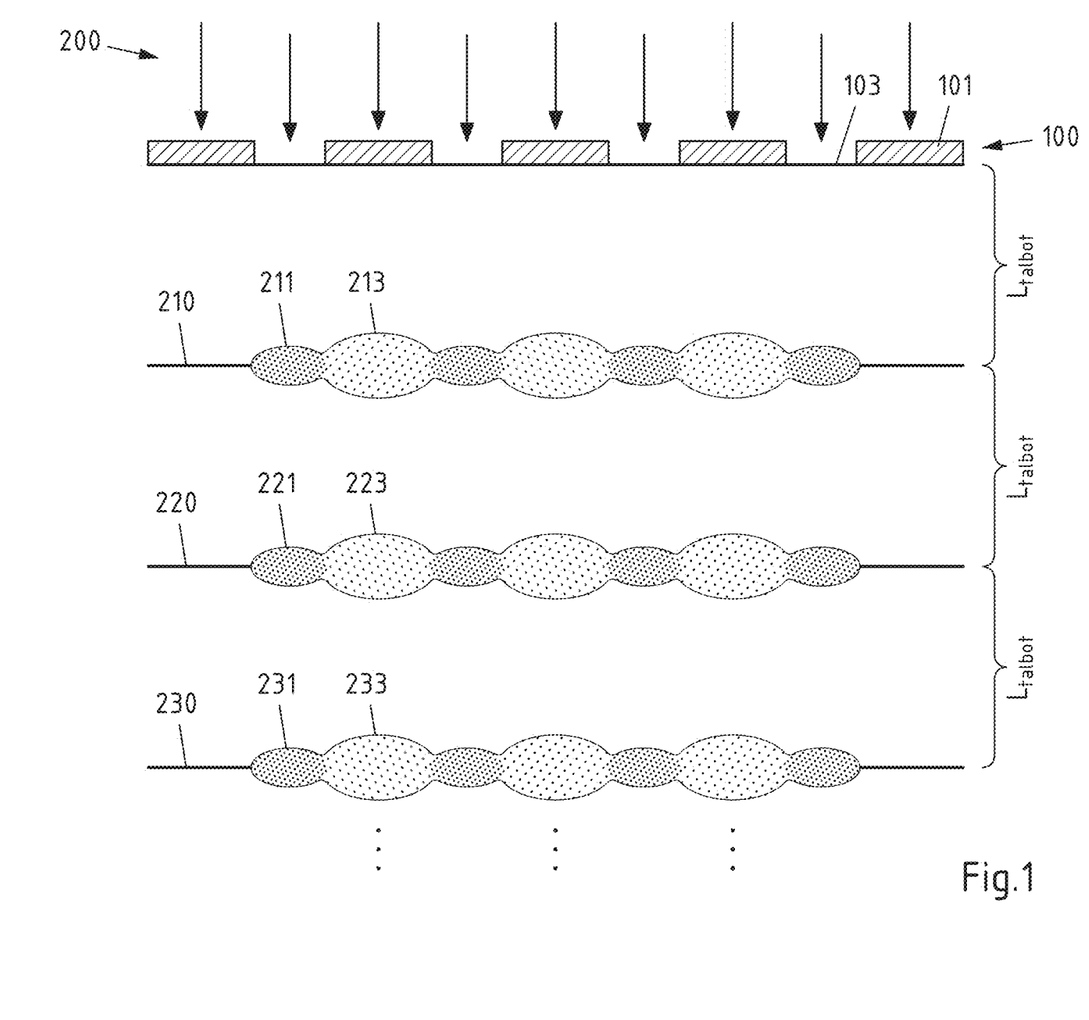
FIG. 1 exemplarily illustrates the Talbot effect.

Turning to the figures, FIG. 1 exemplarily illustrates the Talbot effect in a simplified manner. As shown, a plane light wave 200 illustrated by a series of parallel arrows is incident onto mask 100 (the mask, e.g., being a grating), illustration of a corresponding light source being omitted. As shown, mask 100 comprises a series of light-attenuating features 101 and light-permeable features 103 exemplified by stripes 101 (the figure showing respective cross-sections) of material configured to block light, e.g., of a metal material and regions 103 void of such material. The light may, e.g., be UV light with a wavelength in between, e.g., 200 nm and 500 nm and the regular pitch of the mask may be in between 5 μm and 20 μm.

As illustrated in FIG. 1, images of the grating are formed at regular distances following the plane of mask 100, the distance referred to herein as Talbot distance $L_{Talbot}$. In other words, e.g. a first image 210 (Talbot image or self-image) is formed at the Talbot distance being composed of high intensity regions 211 and low intensity regions 213, the high and low intensity regions arranged in correspondence with the light-attenuating features 101 and the light-permeable features 103. As shown, the image 210 of the mask 100 is essentially perfectly aligned with mask 100. Further Talbot images 220 and 230 are shown with corresponding high intensity regions 221, 231 and corresponding low intensity regions 223, 233. It is noted that, as indicated by the dotted lines below image 230 in the figure, further Talbot images may be formed that are not illustrated in the figure.

Figure 2:
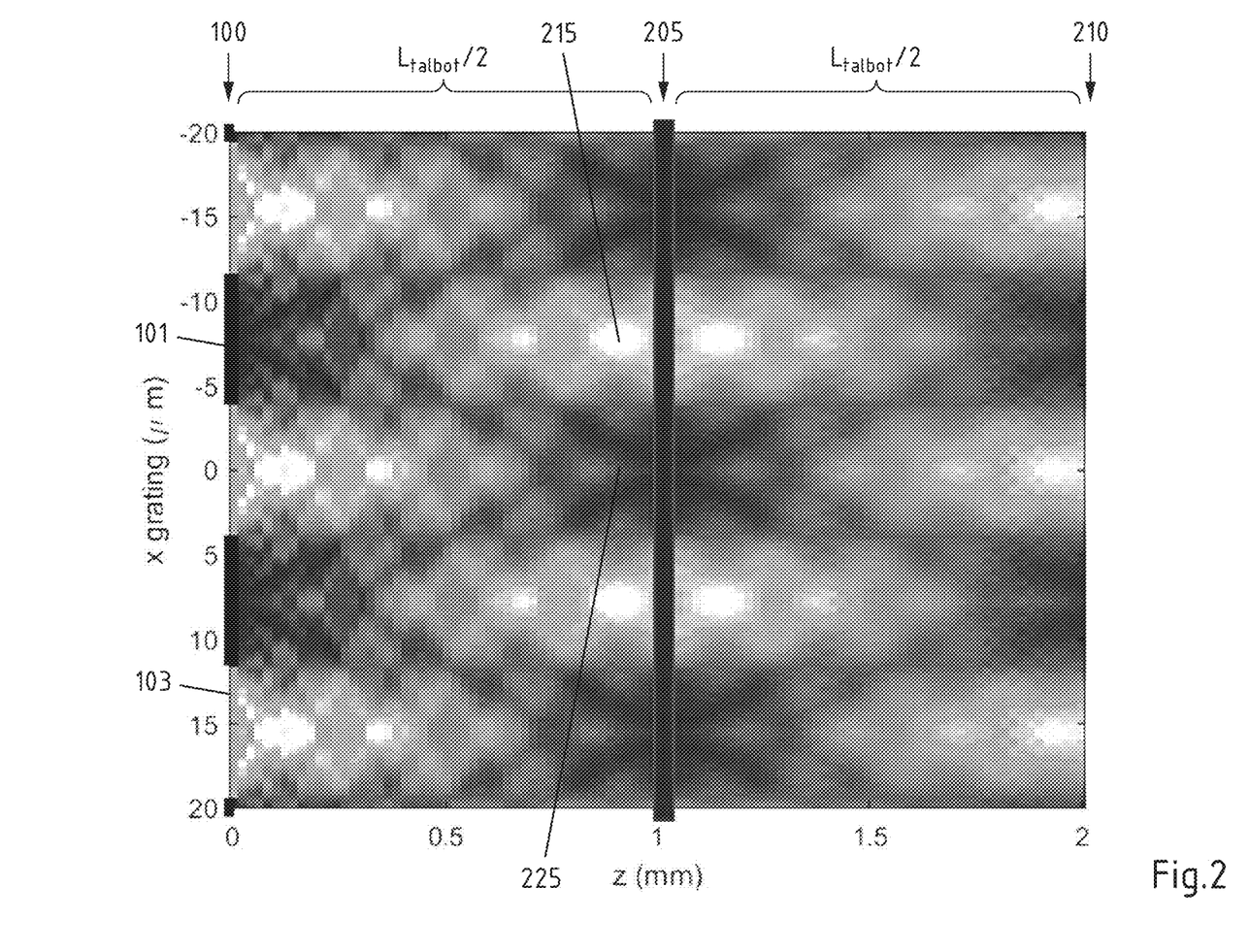
FIG. 2 exemplarily illustrates a first method employing the Talbot effect for manufacturing a dual grating.

Further, additional Talbot images are formed for example at distances of $L_{Talbot}/2$, $3L_{Talbot}/2$, and so on, i.e. for example in the centre between images 210 and 220, that are not illustrated in the figure. Such images are phase shifted as compared to the illustrate images and thus form negative images of the mask 100. It is noted that also other periodic intensity patterns may be formed at different fractions of the Talbot distance. For example, a pattern at z=0.5 mm as shown in FIG. 2 below has a higher frequency than the mask itself. This may be useful e.g. as a given mask can be employed for producing a periodic structure of different frequency.

As explained in detail above, it was found that the Talbot effect can be advantageously exploited to achieve an improved mutual alignment of periodic structures formed on opposing surfaces of a common substrate, e.g. of the above discussed dual gratings. By exploiting the self-imaging capability of the Talbot effect, a mutual alignment of such periodic structures can be achieved that is essentially perfect and may thus enable drastically improving alignment accuracy of currently available lithographic methods.

FIG. 2 illustrates a first exemplary method of advantageously exploiting the Talbot effect, which is based on self-imaging of a mask provided on one surface of the substrate to form a corresponding grating on the opposing surface of the substrate based on a self-image of the grating mask. In FIG. 2, a mask 100 with a regular pitch of 15.5 μm is arranged on the left of the figure and a plane light wave with a central wavelength of 365 nm and a wavelength spread of 25 nm (Full Width Half Maximum, (FWHM)) is incident onto mask 100 from the left. The Talbot length is in this case approximately 2.0 mm. A corresponding plane 205 where a first negative Talbot image is formed is indicated by black line 205 and a first positive Talbot image is formed at the right edge 210 of the image. The mask 100 is formed on a left surface (first surface) of a transparent substrate (e.g. of glass) of approximately 1 mm thickness ($L_{Talbot}/2$) arranged in between this mask 100 and the image plane 205 of the first negative Talbot image. Illustration of the substrate is omitted for conciseness of the figure. The mask 100 may have been formed on the first surface of the substrate using a conventional mask lithography technology.

As illustrated in the FIG. 2, by exploiting the self-imaging capability of the Talbot effect, the first negative image enables illumination of the right surface (the second surface)

of the substrate with a periodic intensity pattern where high intensity regions 215 are arranged in correspondence with the light-attenuating features 101 of mask 100 and where low intensity regions 225 are arranged in correspondence with the light-permeable features 103 of mask 100. When a positive photoresist (an example of a light-sensitive material) is provided on the second surface of the substrate, the intensity distribution at image plane 205 degrades the photoresist in regions corresponding to the light-attenuating features 101 of mask 100 such that these regions can be removed when employing a developer. As explained above, a metallic grating can then be formed on the second surface based on this patterned coating of remaining photoresist using e.g. a lift-off process. In this way, a grating is formed on the second surface of the substrate that is essentially perfectly aligned with the mask or grating formed on the first surface of the substrate.

Figure 3:
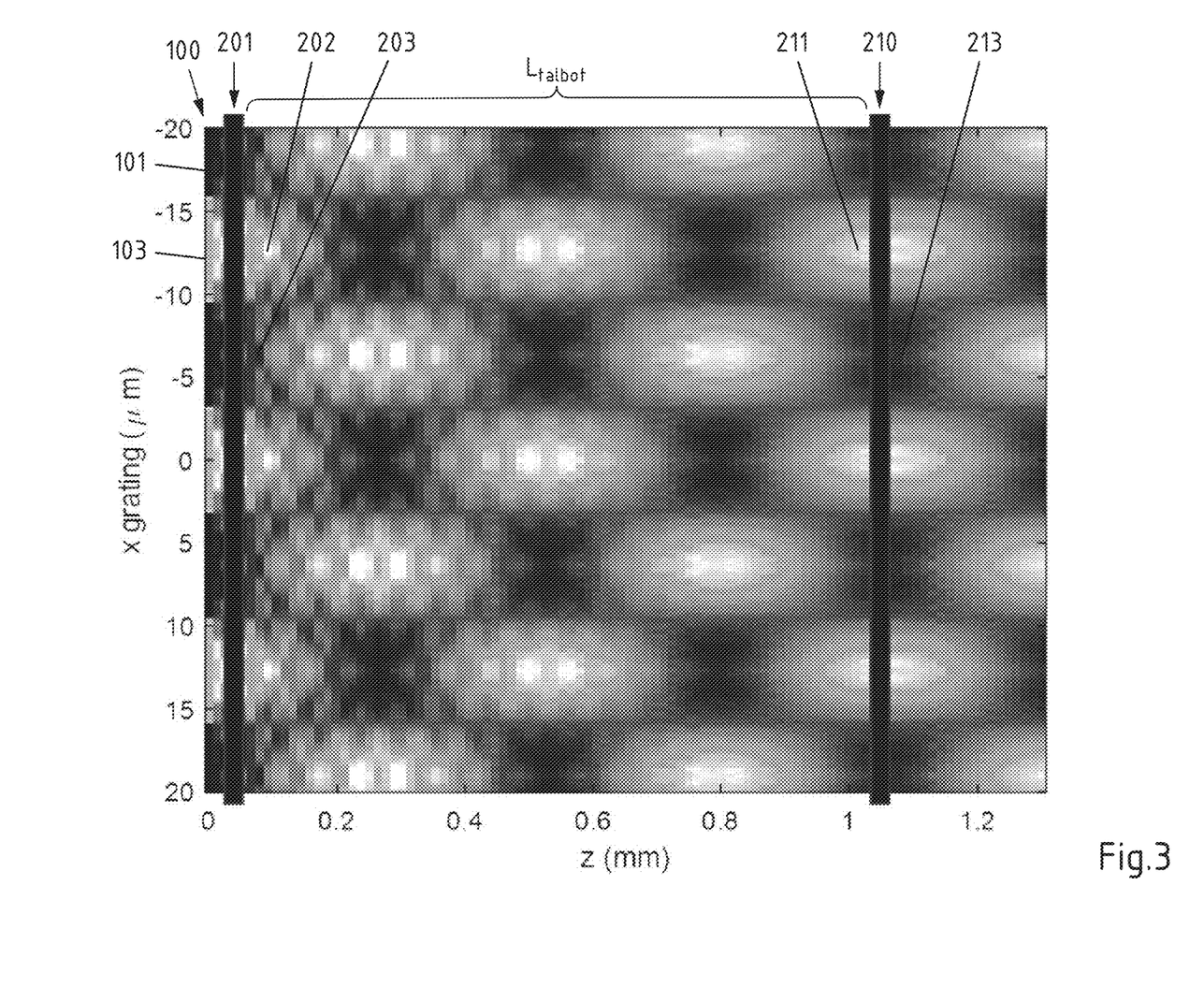
FIG. 3 exemplarily illustrates a second method employing the Talbot effect for manufacturing a dual grating.

FIG. 3 illustrates a second exemplary method of advantageously exploiting the Talbot effect, which is based on self-imaging of a mask provided in close proximity with a surface of a substrate. In FIG. 3, a mask 100 with a regular pitch of 12.7 µm is arranged to the left of the figure and a plane light wave with a central wavelength of 400 nm and a wavelength spread of 25 nm (Full Width Half Maximum, (FWHM)) is incident onto mask 100 from the left (not shown). Reference numeral 201 indicates a plane where a Talbot image of zeroth order immediately after the mask is formed. This Talbot image comprises high intensity regions 202 and low intensity regions 203. A corresponding plane 210 where a positive Talbot image is formed is indicated by black line 210. The first positive Talbot image includes high intensity regions 211 and low intensity regions 213. The mask 100 is in close proximity with a left surface (first surface) of a transparent substrate (e.g. of glass) of approximately 1 mm thickness ($L_{Talbot}$) arranged in between mask 100 and the image plane 210 of the positive Talbot image. As in FIG. 2, illustration of the substrate is omitted for conciseness of the figure. The mask 100 may have been formed using a conventional mask lithography technology.

As illustrated in FIG. 3, by exploiting the self-imaging capability of the Talbot effect, the zeroth Talbot image and the second positive Talbot image on planes 201 and 210 enable illumination of the left surface (the first surface) and of the right surface (the second surface) of the substrate, respectively with corresponding periodic intensity patterns where high intensity regions 202 and 211 are arranged in correspondence with the light-permeable features 103 of mask 100 and where low intensity regions 203 and 213 are arranged in correspondence with the light-attenuating features 101 of mask 100. When a negative photoresist (an example of a light-sensitive material) is provided on the first surface of the substrate and on the second surface of the substrate, the intensity distribution at image plane 201 and at image plane 210 enhances strength of the photoresist in regions corresponding to the light-permeable features 103 of mask 100 such that these regions are not removed when employing a developer that removes regions of the photoresist not exposed to light (regions 203 and 213). As explained above, a metallic grating (or mask) can then be formed on the first surface of the substrate and on the second surface of the substrate based on the patterned coatings of respectively remaining photoresist on these surfaces using e.g. a lift-off process. In this way, respective metallic gratings are formed on the first surface of the substrate and on the second surface of the substrate that are both essentially perfectly aligned with mask 100 positioned in close proximity to the first surface during the step of exposing the photoresist.

It is to be understood that the presentation of embodiments in this section is merely exemplary and non-limiting.

Other features of the present disclosure may become apparent from the detailed description considered in conjunction with the accompanying drawings. It is to be understood, however, that the drawings are designed solely for purposes of illustration and not as a definition of the limits of the disclosure, for which reference should be made to the appended claims. It should be further understood that the drawings are not drawn to scale and are merely intended to conceptually illustrate the structures and procedures described herein.

LIST OF REFERENCE SIGNS

100 Mask
101 Light-attenuating features
103 Light-permeable features
200 Plane light wave
202 High intensity region
203 Low intensity region
205 First negative Talbot image
210 First image
211 High intensity region
213 Low intensity region
220 Talbot image
230 Talbot image
221 High intensity region
223 Low intensity region
231 High intensity region
233 Low intensity region

The invention claimed is:

1. A method for manufacturing a lighting device comprising:
providing a transparent substrate comprising at least a first surface and a second surface opposing the first surface;
providing light-sensitive material on at least one of the first surface and the second surface;
exposing the light-sensitive material to light by applying the light from a light source onto a mask comprising a periodic pattern of light-attenuating features with interspaced light-permeable features and configured to cause the light from the light source to form a periodic distribution of high intensity regions with interspaced low intensity regions at at least the at least one of the first surface and the second surface on which the light-sensitive material is provided; and
forming a periodic structure based on the exposed light-sensitive material, the periodic structure comprising light-attenuating features and light-permeable features,
a thickness d of the substrate between the first surface and the second surface is given approximately by:

$$d = n\frac{a^2 n_1^2}{\lambda n_2},$$

where n is an integer, n≥1, a is a period of the periodic pattern of light-attenuating features and interspaced light-permeable features of the mask, λ is a wavelength of the light emitted from the light source, $n_1$ is a refractive index of a medium between the mask and the first surface, the first surface faces the mask, and $n_2$ is a refractive index of the substrate between the first surface and the second surface.

2. The method according to claim 1, wherein:
the light-sensitive material is provided on one of the first and the second surface of the substrate and the mask is provided on the other one of the first and the second surface;
the exposing comprises illuminating the light-sensitive material with a self-image of the mask; and
the forming comprises forming the periodic structure based on the exposed light-sensitive material on the first surface or the second surface on which the light-sensitive material has been provided.

3. The method according to claim 1, wherein:
the light-sensitive material is provided on the first surface of the substrate and on the second surface of the substrate;
the exposing comprises simultaneously illuminating the light-sensitive material on the first surface of the substrate and the light-sensitive material on the second surface of the substrate with respective self-images of the mask; and
the forming comprises forming the periodic structure based on the exposed light-sensitive material on the first surface of the substrate and based on the exposed light-sensitive material on the second surface of the substrate.

4. The method according to claim 3, wherein, at least during the exposing, the mask is arranged relative to the substrate to cause the light from the light source to form a periodic distribution of high intensity regions with interspaced low intensity regions at the first surface and at the second surface.

5. The method according to claim 3, wherein, at least during the exposing, a smallest distance between the mask and the substrate is less than half of a Talbot length.

6. The method according to claim 3, wherein, at least during the exposing, a smallest distance between the mask and the substrate is less than one fourth of a Talbot length.

7. The method according to claim 3, wherein, at least during the exposing, the mask is in contact with the one of the first surface or the second surface of the substrate closest to the mask.

8. The method according to claim 3, wherein the light-sensitive material provided on a surface of the substrate closest to the mask is partially transparent for light emitted from the light source.

9. The method according to claim 1, wherein, at least during the exposing, the mask is arranged parallel to both of the first surface and the second surface.

10. The method according to claim 1, wherein the period a is between 5 µm and 20 µm.

11. The method according to claim 1, wherein the period a is between 9 µm and 16 µm.

12. The method according to claim 1, wherein the periodic pattern comprises a grating having parallel, elongated elements, and the light-attenuating features correspond to essentially identical, parallel, elongated elements as the parallel, elongated elements of the grating.

13. The method according to claim 1, wherein the periodic pattern is formed from a material that comprises a metal.

14. The method according to claim 1, wherein:
the light-sensitive material is a photoresist; and
the method further comprises:
applying a developer to the at least one of the first surface and the second surface on which the light-sensitive material is provided after the light from the light source has been applied to remove the light-sensitive material at least partially in regions corresponding to the low intensity regions; and
replacing remaining light-sensitive in regions corresponding to the high intensity regions or the low intensity regions by a material comprising a metal to form the periodic structure based on the exposed light-sensitive material.

15. The method according to claim 1, wherein the light source comprises at least one of at least one light emitting diode (LED) and at least one mercury (Hg) arc lamp.

16. The method according to claim 1, wherein the wavelength is an ultraviolet (UV) wavelength.

17. The method according to claim 1, wherein the wavelength is between about 200 nm and about 500 nm.

18. The method according to claim 1, wherein the wavelength is between about 340 nm and about 460 nm.

19. The method according to claim 1, further comprising:
selecting which of a positive and a negative photoresist to use as a first light-sensitive material based on a distance from the mask to the first surface of the substrate, the first surface of the substrate opposing the mask;
providing the first light-sensitive material on the first surface of the substrate;
selecting which of the positive and a negative photoresist to use as a second light-sensitive material based on the thickness of the substrate;
providing a second light-sensitive material on the second surface of the substrate;
simultaneously illuminating the first light-sensitive material and the second light-sensitive material with respective self-images of the mask; and
forming the periodic structure based on the exposed light-sensitive material on the first surface of the substrate and the second surface of the substrate.

20. The method according to claim 19, wherein:
one of the positive photoresist and the negative photoresist is selected as the first light-sensitive material; and
a different one of the positive photoresist and the negative photoresist is selected as the second light-sensitive material in response to the thickness being about m/2 of a Talbot length, in which m is an odd integer.

* * * * *